(12) United States Patent
Ichijo et al.

(10) Patent No.: US 7,465,966 B2
(45) Date of Patent: Dec. 16, 2008

(54) FILM FORMATION METHOD AND MANUFACTURING METHOD OF SEMICONDUCTOR DEVICE

(75) Inventors: Mitsuhiro Ichijo, Tochigi (JP); Taketomi Asami, Saitama (JP); Kunihiko Fukuchi, Kanagawa (JP); Satoshi Toriumi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/804,053

(22) Filed: Mar. 19, 2004

(65) Prior Publication Data

US 2004/0185673 A1    Sep. 23, 2004

(30) Foreign Application Priority Data

Mar. 19, 2003    (JP)    ............................. 2003-076646

(51) Int. Cl.
*H01L 21/00*    (2006.01)

(52) U.S. Cl. .................. 257/153; 257/154; 257/758

(58) Field of Classification Search .................. 438/153, 438/154, 758
See application file for complete search history.

(56) References Cited

U.S. PATENT DOCUMENTS 5,755,938 A * 5/1998 Fukui et al. ............. 204/298.23
6,631,022 B1 * 10/2003 Kihira et al. ................. 359/265
6,781,162 B2 * 8/2004 Yamazaki et al. ........... 257/184
2001/0052950 A1    12/2001 Yamazaki et al.
2004/0099215 A1 * 5/2004 Danek et al. ............. 118/723 E

FOREIGN PATENT DOCUMENTS

| JP | 58-092218 | 6/1983 |
| JP | 59-068921 | 4/1984 |
| JP | 62-12136 | 1/1987 |
| JP | 08-78329 | 3/1996 |
| JP | 08-274089 | 10/1996 |
| JP | 2000-340562 | 12/2000 |
| JP | 2001-345453 | 12/2001 |

* cited by examiner

*Primary Examiner*—Long Pham
(74) *Attorney, Agent, or Firm*—Nixon Peabody LLP; Jeffrey L. Costellia

(57) ABSTRACT

A new film formation method that makes it possible to form a film with a little concentration of contaminants from a material and to form a film on a low heat-resistant member is proposed. Further, a method for forming a film that can keep semiconductor properties is proposed. In the film formation method of the present invention, a first film that is to be a target is formed by employing plasma CVD, and the first film is sputtered, thereby forming the second film on a surface of the substrate to be processed in one chamber. By employing the film formation method of the present invention for a protective film of a semiconductor element, deterioration of a semiconductor device can be controlled.

45 Claims, 8 Drawing Sheets

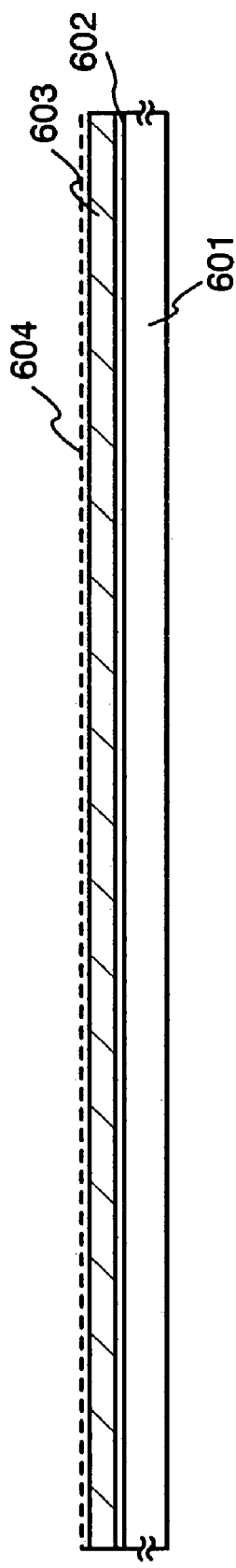
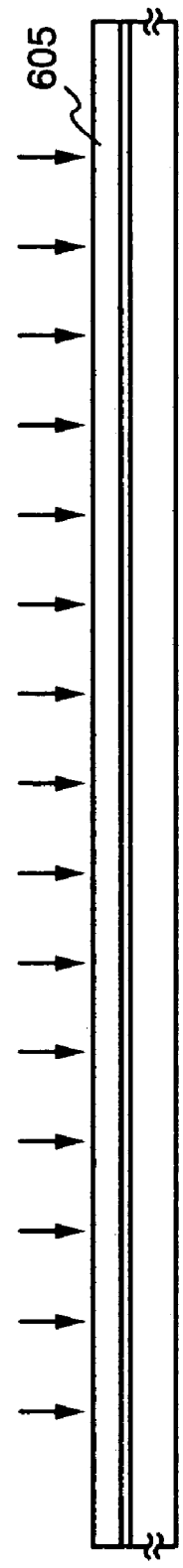
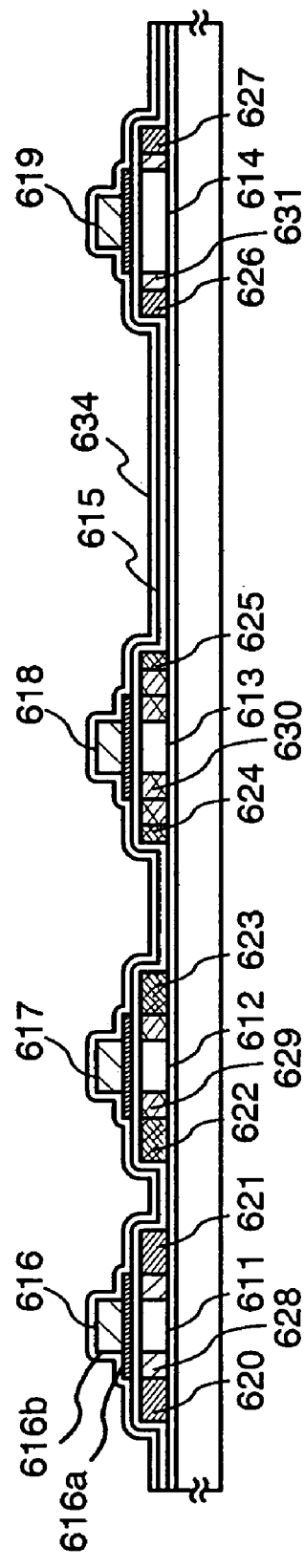
FIG. 4A
FIG. 4B
FIG. 4C

FILM FORMATION METHOD AND MANUFACTURING METHOD OF SEMICONDUCTOR DEVICE

BACKGROUND OF THE INVENTION

1. Field of the Invention

The present invention relates to a film formation method of a thin film. Further, the present invention relates to a manufacturing method of a semiconductor device using the film formation method.

2. Description of the Related Art

As for existing film formation methods, PVD (physical vapor deposition) using physical means such as vacuum deposition, sputtering, or ion plating; CVD (chemical vapor deposition) using chemical reaction of energy such as heat, plasma, or light; and formation by spraying or coating such as surface polymerization, a sol-gel process, or electroplating are given as typical examples.

The film thickness of a film composing a semiconductor device is from several nm to approximately 1μm. The chemical vapor deposition or sputtering is frequently used for the formation methods of the thin film.

As a typical example of a thin film used for a semiconductor device, a conductive film or various kinds of insulating films for insulating each wiring are used. A silicon nitride film is further given as a typical example of such an insulating film. A silicon nitride film is effective in preventing penetration of moisture or alkali ions. Therefore, a silicon nitride film is employed for a coating film of a substrate, or a protective film of a semiconductor element.

As a film formation method of an insulating film, plasma CVD is employed. The plasma CVD is generally used because of the advantages of high step coverage, high moisture resistance, and ability to form a film at a low temperature (Reference 1: Japanese Patent Laid-Open No. 8-274089).

A film formed by plasma CVD, typified by a silicon nitride film has relatively high hydrogen content. This is because ammonia other than silane and nitrogen is used for a reactive gas.

Thus, in the film having high hydrogen content, hydrogen is desorbed from the film by heat or application of voltages. As a result, troubles of change in characteristics such as a change in the threshold or acceleration of deterioration is caused in a semiconductor element or a semiconductor device using the semiconductor element.

Therefore, a process of "dehydrogenation" in which the film formed by plasma CVD is heated at a high temperature is required. As shown in Reference 1, a method for forming a film in the state where the decomposition of a source gas is controlled is proposed to form a film with low hydrogen content even without the dehydrogenation.

Further, a technique that makes it possible to control the hydrogen content of a silicon nitride film by controlling the decomposition of ammonia is described in Reference 1.

When a film is formed by normal CVD, heating at a high temperature is required. On the other hand, plasma CVD can form a film at a relatively low temperature (around 400° C.); however, heating at a temperature higher than 480° C. is required to reduce the hydrogen content in the film. In this case, when a film formed from a low heat-resistant material, typified by an organic resin such as acrylic, or aluminum wirings are applied to a base film, another film cannot be formed thereover by plasma CVD.

When a film is formed by sputtering, a source gas and a target can be selected depending on the characteristics of the film. For example, silicon or silicon nitride should be employed as a target, and nitrogen, argon, or nitrogen and argon should be employed for a sputtering gas thereby forming the silicon nitride film with a low content of hydrogen. A contaminant (generally, hydrogen of ammonia ($NH_3$) used in plasma CVD) from a source gas can hereby be reduced.

Further, a film can be formed at a low temperature by sputtering, so that it can be formed directly on an organic resin substrate or an organic resin member each of which has low heat resistance.

However, sputtering has the following problems: (1) difficulty and high cost of forming a target for a large substrate, (2) decline in productivity which is caused by the maintenance carried out in a chamber open due to impracticability of self-cleaning in the chamber, (3) impurities in an atmosphere that can easily contaminate a film when a film is formed, (4) impurities in a target that contaminates a product.

SUMMARY OF THE INVENTION

In view of the above problems, the present invention proposes a film formation method in which a film can be formed with a low concentration of a contaminant from a material and the film can be formed on a member having low heat resistance. A method for forming a film in which semiconductor properties can be kept is also proposed in the invention.

The object of the present invention is that a reactive gas such as a silicide gas is decomposed by electromagnetic energy or thermal energy; films are laminated on the electrode that can be applied with any of direct current (DC), alternating current (AC) and high frequency power; a substrate is carried into a chamber; and a coating is formed over the substrate by sputtering the film on the electrode with rare gas or the like. According to the present invention, since a film can be formed without using hydride gas typified by hydrogen nitride, a film with a low hydrogen content can be formed on a substrate.

Further, heating at a high temperature is not required since a coating formed on the surface of the substrate to be processed by sputtering. Therefore, when the films are formed as films of a semiconductor element (a base insulating film blocking impurities penetrating through the substrate, a gate insulating film, an interlayer insulating film, and a protective film), they can be formed in contact with a surface of an organic resin film to be processed or an organic resin substrate each of which has low heat resistance.

A film formation method and a manufacturing method of a semiconductor device based on the object of the present invention can include the structures shown below.

The film formation method includes the following steps: a first film is formed in a chamber by using a first gas; the substrate is carried into the chamber after the first film is formed; and a second film is formed over a surface of the substrate to be processed by using the first film and a second gas.

As the second film, a silicon nitride film, a silicon oxide film, or a silicon oxynitride film can be formed.

The first film and the second film may be formed of the same material. In this case, a rare gas or a rare gas mixture can be used for the second gas.

Further, the first film may be reacted with the second gas to form the second film. In this case, a reactive gas is used in addition to a rare gas or a rare gas mixture for the second gas.

When the second film is a silicon nitride film, a silicide gas and nitrogen are used for the first gas; and a gas selected from helium (He), neon (Ne), argon (Ar), krypton (Kr), and xenon (Xe), or a mixture thereof is used for the second gas.

Alternatively, a silicide gas may be used for the first gas; and nitrogen and one selected from helium (He), neon (Ne), argon (Ar), krypton (Kr), and xenon (Xe), or a mixture thereof may be used for the second gas.

When the second film is a silicon oxide film, a silicide gas and oxygen are used for the first gas; and one selected from helium (He), neon (Ne), argon (Ar), krypton (Kr), and xenon (Xe), or a mixture thereof may be used for the second gas.

Similarly, a silicide gas may be used for the first gas; and oxygen and one selected from helium (He), neon (Ne), argon (Ar), krypton (Kr), and xenon (Xe), or a mixture thereof can be used for the second gas.

When the second film is a silicon oxynitride film, silane, oxygen, and nitrogen; or a silicide gas and nitrogen oxide are used for the first gas; and one selected from helium (He), neon (Ne), argon (Ar), krypton (Kr), and xenon (Xe), or a mixture thereof is used for the second gas.

Similarly, a silicide gas may be used for the first gas; and oxygen, nitrogen, and one selected from helium (He), neon (Ne), argon (Ar), krypton (Kr), and xenon (Xe), or a mixture thereof may be used for the second gas.

Monosilane, disilane, trisilane, or the like can be used for the silicide gas.

When the second film is formed, the pressure inside the chamber is 20 Pa or less. Further, the second film is formed over a glass substrate, a plastic substrate, or an organic resin film.

A formation method of the first film can use plasma CVD, and a precipitation method of the second film can use sputtering.

Further, the present invention provides a manufacturing method of a semiconductor device using the second film formed by the above film formation method as a base insulating film that blocks impurities from a substrate of a semiconductor element, a gate insulating film, an interlayer insulating film, a protective film. Incidentally, the semiconductor element is a thin film transistor, an organic thin film transistor, a thin film diode, a photoelectric conversion element, or a resistor.

BRIEF DESCRIPTION OF THE DRAWING

FIGS. 4A to 4C show manufacturing steps of an active matrix substrate using the present invention.

DETAILED DESCRIPTION OF THE INVENTION

Embodiment Mode 1

In this embodiment mode, steps for forming a silicon nitride film is adopted as a typical example of a film formed on an object substrate surface will be described. Note that, instead of the silicon nitride film, a silicon oxide film or a silicon oxynitride film can be adopted.

Figure 1A:
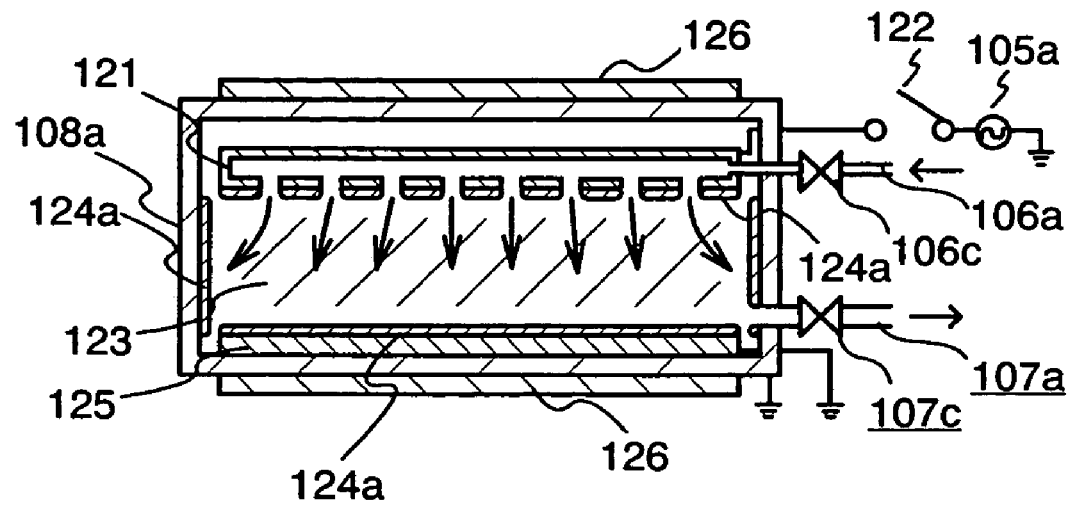
FIGS. 1A and 1B show a cross section of a chamber used in the present invention.

A cross section of a chamber in a plasma CVD system used in the present invention will be explained with reference to FIG. 1. In FIG. 1A, a first electrode 121 (an upper electrode, a shower electrode, and a high frequency electrode) connected to a high frequency power supply 105a and a grounded second electrode (a lower electrode and a ground electrode) 125 are provided in a grounded chamber 108a. First electrode 121 has a hollow structure, and a source gas supplied from a distribution system 106a passes through the electrode, is ionized and supplied into the chamber. An exhaust system 107a is provided on a chamber, and exhaust gas after reaction is exhausted therefrom. In this embodiment mode, the hollow structure (a structure in which plural perforated plates are piled together, and a gas can be exhausted therefrom in a dispersed manner: a so-called shower-head structure) is employed for the electrode structure; however, the structure is not limited thereto. The distribution system may be provided separately from the first electrode. Further, valves (106c and 107c) are provided in the distribution system 106a and an exhaust system 107a, thereby controlling the pressure of a gas to be supplied, and the pressure in a chamber.

The external wall of a chamber is provided with a heater 126. Thus, the chamber has a hot wall structure.

The side of the chamber is provided with a window (not illustrated). The window is opened and closed, and the substrate can be transferred from a cassette, in which substrate is loaded, into the chamber through the window by using a transport mechanism such as a robot arm.

Next, a film formation method is described with reference to FIGS. 1A and 1B. In this embodiment mode, a formation method of a silicon nitride film will be explained.

Firstly, the silicon nitride film is formed by plasma CVD. Here, Silane gas and nitrogen are used for a source gas. The film shall be formed under the following conditions: the pressure in a chamber of $1.33 \times 10^1$ Pa to $1.33 \times 10^3$ Pa ($1 \times 10^{-1}$ Torr to $1 \times 10^1$ Torr), the temperature at 80° C. to 600° C., and the power supply frequency of the high frequency power supply of 10 MHz to 500 MHz. Note that, the distribution of the silicon nitride film is dependent on the temperature of the heater.

As shown in FIG. 1A, the silane gas and nitrogen are supplied from the distribution system 106a into the chamber; a switch of the power supply 122 is turned on; and the high frequency voltage is applied to the electrode; thus generating plasma 123. Chemically active excited species such as an ion or a radical of the silane gas or nitrogen which are generated in the plasma react, thereby forming a product, a silicon nitride film 124. The silicon nitride film is formed in the chamber, particularly on the first electrode 121 and a second electrode 125. The film thickness of the silicon nitride film 124a may preferably be 1 μm or less thereby avoiding peeling.

Next, by sputtering, a silicon nitride which is to be a target is precipitated on the substrate. An inert gas such as helium (He), neon (Ne), argon (Ar), krypton (Kr), xenon (Xe), or the like; or a mixture thereof is used as the sputtering gas. Further, it is preferable to use nitrogen as well. In this embodiment mode, argon is used as the inert gas. The sputtering shall be carried out under the following conditions: the pressure in the chamber of 20 Pa or less, preferably $1.33 \times 10^{-1}$ Pa to $1.33 \times 10^1$ Pa ($1 \times 10^{-3}$ Torr to $1 \times 10^{-1}$ Torr), and the power supply frequency of a high frequency power supply of 10 to 500 MHz. The temperature in the chamber can be set arbitrarily according to the heat resistance of base materials or the substrate where precipitation is performed, and a product can be precipitated on a substrate surface even at room temperature.

Figure 1B:
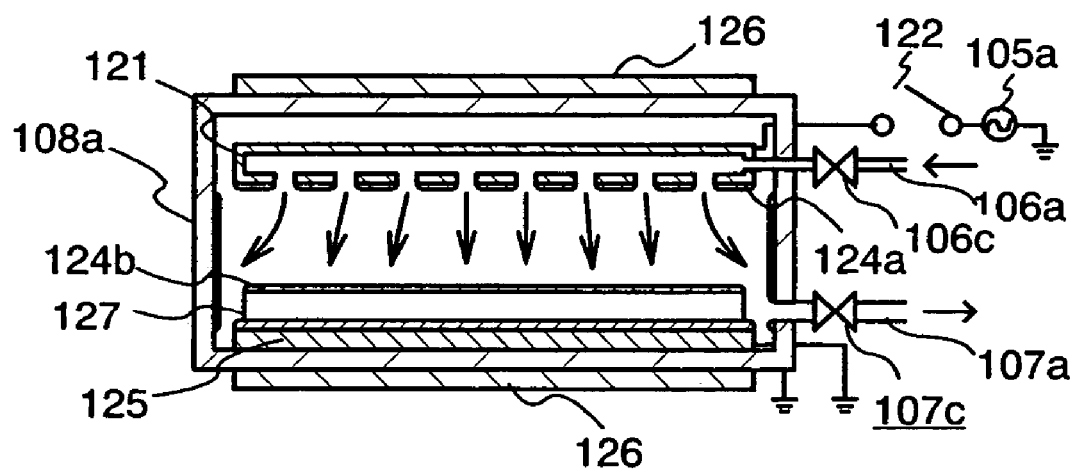

As shown in FIG. 1B, a substrate 127 is installed in a chamber, and nitrogen and argon are supplied into the chamber from the distribution system 106a. Next, sputtering is performed by using a silicon nitride film as a target, and argon as a sputtering gas; a silicon nitride film 124a is precipitated on the object substrate surface. In FIG. 1B, 124b is a silicon nitride film sputtered over the substrate surface.

Figure 7:
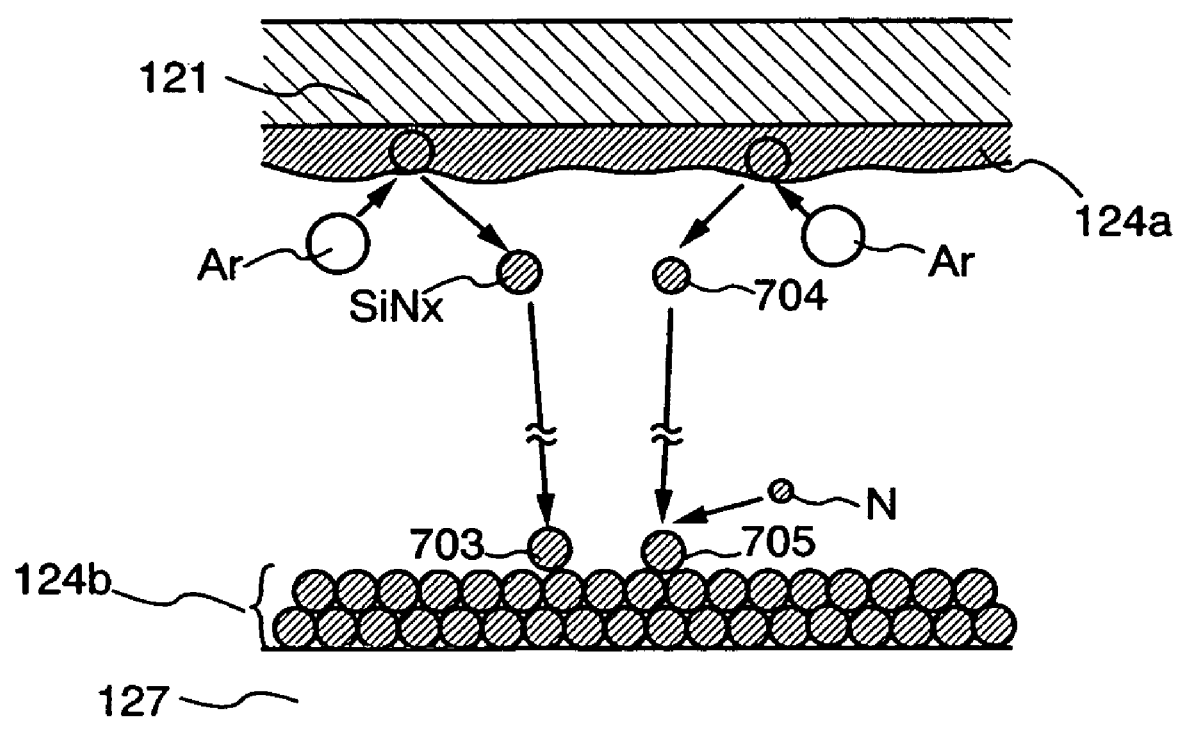
FIG. 7 shows a frame format of a reactive process of the present invention.

In FIG. 7, reaction in this embodiment mode will be explained. FIG. 7 is an enlarged view of the first electrode surface and substrate surface.

A sputtering gas (argon ion in FIG. 7) runs into the silicon nitride film (target) 124a formed on the surface of the first electrode 121 by plasma CVD; thus, a target is sputtered and a silicon nitride compound is precipitated (703) on the substrate 127. Note that, by using nitrogen in addition to an inert gas as the sputtering gas, nitrogen is supplied to the silicon nitride chemical compound (704) in which a part of nitrogen is removed by the collision of the sputtering gas; thus, more silicon nitride (705) can be precipitated on the substrate.

For improving the sputtering rate, a magnet may be provided on the first electrode 121. In that case, the magnetron discharge in which a magnetic field is perpendicular to the electric field can be used.

Further, in the sputtering process of this embodiment mode, a gas is supplied through the electrode having a hollow structure; however, nitrogen and argon can be supplied arbitrarily from the distribution system.

Further, before forming the silicon nitride film that is to be a target, a gas such as $F_2$, $NF_3$, fluorocarbon, $SF_6$, or $CO_X$ is preferably supplied into a chamber thereby cleaning the inside of the chamber. Since it is easy to clean the inside of the chamber, a plasma CVD system requires less maintenance compared with a sputtering system.

Further, since a product formed by plasma CVD is precipitated on the substrate by sputtering, the product can be formed in a state where contamination of impurities included in a target or in a chamber atmosphere is prevented in comparison with existing sputtering methods. Further, unlike in the case of an existing plasma CVD technique, a silicon nitride film including fewer impurities from raw materials, particularly less contamination of hydrogen, can be formed on the object substrate surface.

Embodiment Mode 2

In this embodiment mode, steps for forming a silicon nitride film using a film formation system of Embodiment Mode 1 shown in FIG. 1 will be explained. The like reference numerals in Embodiment Mode 1 are used for the corresponding parts in this embodiment mode. Note that, a silicon oxide film or a silicon oxynitride film can be formed instead of the silicon nitride film by employing this embodiment mode.

Firstly, a silicon film is formed by plasma CVD. Here, Silane gas is used for a source gas. The film shall be formed under the following conditions: the pressure in a chamber of $1.33 \times 10^1$ Pa to $1.33 \times 10^3$ Pa ($1 \times 10^{-1}$ Torr to $1 \times 10^1$ Torr), the temperature at 300° C. to 600° C., and the power supply frequency of the high frequency power supply of 10 MHz to 500 MHz.

As shown in FIG. 1A, silane gas is supplied from the distribution system 106a into the chamber; a switch 122 of the power supply is turned on; and high frequency voltage is applied to an electrode; and plasma 123 is generated; thus, a product, a silicon film 124a is formed. The silicon film is formed in the chamber, particularly on a first electrode 121 and a second electrode 125. The film thickness of the silicon film 124a may preferably be 1μm or less thereby avoiding peeling.

Next, by sputtering, a silicon film that is to be a target is precipitated on the substrate. A silicon nitride film is formed by reactive sputtering using nitrogen and an inert gas such as helium (He), neon (Ne), argon (Ar), krypton (Kr), xenon (Xe), or the like, or a mixture thereof for a sputtering gas. In this embodiment mode, argon is used as the inert gas. The sputtering shall be carried out under the following conditions: the pressure in the chamber of 20 Pa or less, preferably $1.33 \times 10^{-1}$ Pa to $1.33 \times 10^1$ Pa ($1 \times 10^{-3}$ Torr to $1 \times 10^{-1}$ Torr), and the power supply frequency of a high frequency power supply of 10 MHz to 500 MHz. The temperature in the chamber can be set arbitrarily according to the heat resistance of base materials or the substrate where precipitation is performed, and a product can be precipitated on a substrate surface even at room temperature.

As shown in FIG. 1B, a substrate 127 is installed in the same chamber, and argon and nitrogen are supplied from the distribution system 106a into the same chamber. Next, sputtering is performed by using a silicon film as a target, and argon as a sputtering gas. A silicon nitride film 124a is hereby precipitated on the object substrate surface. In FIG. 1B, 124b is a silicon nitride film sputtered over the substrate surface.

Figure 8:
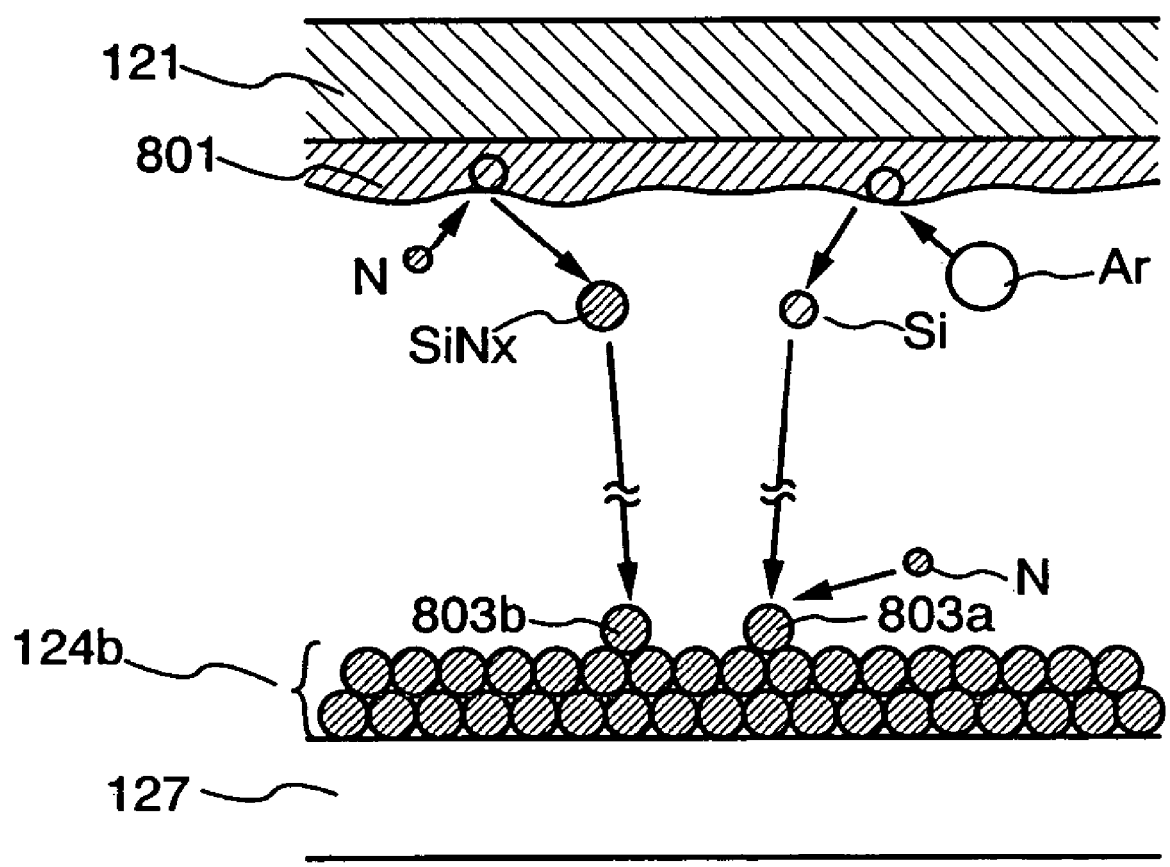
FIG. 8 shows a frame format of a reactive process of the present invention.

In FIG. 8, reaction in this embodiment mode will be explained. Argon ion that is a sputtering gas runs into the silicon film 801 that is a target formed on the surface of the first electrode 121 by plasma CVD. Here, sputtering by argon ion and reaction by nitrogen ion occur concurrently. The silicon sputtered by argon ion reacts with nitrogen ion on the substrate, and it is precipitated to be a silicon nitride compound 803a on the substrate. Further, the silicon nitride compound (804b) that is formed by reaction of nitrogen ion with the target (a silicon film), is precipitated on the substrate as it is.

Further, since a product formed by plasma CVD is precipitated on the substrate by sputtering, the product can be formed in a state where contamination of impurities included in a target or in a chamber atmosphere is avoided in comparison with existing sputtering method. Further, unlike in the case of an existing plasma CVD technique, a silicon nitride film including fewer impurities from raw materials, particularly less contamination of hydrogen, can be formed on the object substrate surface.

Embodiment Mode 3

In this embodiment mode, steps for forming different kinds of films in one chamber will be described. Here, the steps for forming a silicon nitride film as a first film, and a silicon oxide film as a second film will be described.

A silicon nitride film is formed on the substrate by using the steps of Embodiment Mode 1 or Embodiment Mode 2.

Thereafter, the substrate is moved to a transfer chamber from within the chamber, and the chamber is cleaned by using a cleaning gas such as $NF_3$, fluorocarbon, $SF_6$, or $CO_X$.

Next, a silicon oxide film to be a target is formed according to Embodiment Mode 1 by using silane and oxygen as a source gas for plasma CVD. Next, a substrate on which the silicon nitride film is formed is carried into the chamber; a silicon oxide film is formed on the substrate surface on which a silicon nitride film is formed by using argon gas as a sputtering gas according to the steps of Embodiment Mode 1.

Note that, as a film formation method of a silicon oxide film, the steps according to Embodiment Mode 2 can also be employed.

Through such steps, different kinds of films can be formed with fewer systems. By employing the steps for forming a semiconductor element and a semiconductor device having the semiconductor element, such films can be formed with fewer systems than before, and cost reduction can be conducted.

EMBODIMENT

Embodiment 1

In this embodiment, an active matrix substrate and a method for manufacturing a display device therewith will be described. Note that, a silicon nitride film that is a protective film of a TFT, one of semiconductor elements, is formed by employing the film formation method explained in Embodiment Mode 1.

In this embodiment, manufacturing steps of a semiconductor element formed according to the present invention and an active matrix substrate having the semiconductor element will be explained with reference to FIG. 4A to FIG. 6B. Note that, as a typical example of the semiconductor element, a thin film transistor is employed in this embodiment; however, other semiconductor element such as an organic thin film transistor, a thin film diode, a photoelectric transducer, or a resistor can also be employed as a semiconductor element.

As shown in FIG. 4A, a base insulating film 602 is formed on a glass substrate (a first substrate 601). A base insulating film shall employ a two-layer structure in this embodiment. A first silicon oxynitride film is formed at a thickness from 50 nm to 100 by using $SiH_4$, $NH_3$ and $N_2O$ as a reactive gas. A second silicon oxynitride film is formed over the first silicon oxynitride film at a thickness from 100 nm to 150 nm by using $SiH_4$ and $N_2O$ as a reactive gas.

Next, an amorphous silicon film 603 (film thickness of 54 nm) is formed over the base insulating film by known techniques such as plasma CVD, low pressure CVD, or sputtering.

The amorphous silicon film 603 is crystallized by employing known art described in Japanese Patent Laid-Open No. 8-78329. In a technique explained in the gazette, a metal element that promotes crystallization is selectively doped into the amorphous silicon film and heat-treated, thereby forming a semiconductor film having a crystal structure that spreads from the doped region as the starting point.

Thereafter, a metal element in a crystalline silicon film is removed or the concentration is reduced by gettering. The gettering may be performed by either of the following methods. One is a method in which a gettering site is formed by doping phosphorus, rare gas (generally, argon), or the like into a part of the crystalline silicon film and is heat-treated thereafter, so that a metal element is segregated. The other is a method in which an amorphous silicon film or a crystalline silicon film each including phosphorus, rare gas, or the like is laminated over an oxide film so as to form a gettering site, so that a metal element is moved to the gettering site after heat treatment. It is preferable that the metal impurity concentration in the crystalline silicon film after gettering be $1 \times 10^{17}/cm^3$ or less (SIMS (secondary ion mass spectrometry) measure/ment limit or less), and more preferably, $5 \times 10^{16}/cm^3$ or less when measured by ICP-MS (inductively coupled plasma mass spectrometry).

Next, a crystalline silicon film 605 is preferably irradiated with a laser beam for eliminating defects left in crystal grains (FIG. 4B) and increasing the degree of crystallinity (the proportion of crystalline component in the volume of a whole film).

Next, a TFT is formed by employing a well-known technique using the crystalline silicon film. A figure thereof is FIG. 4C. The crystalline silicon film is etched to have a desired shape and thus, active regions 611 to 614 are formed. Next, an insulating film containing silicon as the main component, which is to be a gate insulating film 615 is formed after cleaning the surface of the silicon film with an etchant including fluorinated acid.

Subsequently, gate electrodes 616 to 619 (hereinafter, the gate electrode 616 will be explained as a typical example) are formed after cleaning the surface of the gate insulating film. In this embodiment, the gate electrode has a layered structure including the first conductive film 616a in contact with the gate insulating film and the second conductive film 616b in contact with the first conductive film. The first conductive film is formed from a tantalum nitride film, and the second conductive film is formed from a tungsten film. However, the materials of the gate electrode may not be limited to those, and may alternatively be an element selected from tantalum (Ta), tungsten (W), titanium (Ti), molybdenum (Mo), aluminum (Al), copper (Cu), and chrome (Cr), and neodymium (Nd); or an alloy material or a compound material each containing any of these elements as the main component. Silver-copper-palladium alloy (AgPdCu alloy) may be used instead. Further, the gate electrode has a layered structure in this embodiment; however, it is not limited thereto, and either of a mono-layer structure or a multi-layer structure may also be employed.

Next, an impurity element (P, As, or the like) that gives n-type to a semiconductor and an impurity element (B or the like) that gives p-type thereto, phosphorus and boron here, are doped appropriately, and source regions and drain regions 620 to 627 and LDD regions (lightly doped drain regions) 628 to 631 of an n-channel TFT and a p-channel TFT are formed. A part of each LDD region 628 to 630 is covered with each gate electrode; however, the LDD region 631 is not covered with the gate electrode. Note that, as for steps for forming a gate electrode and an LDD region, the steps disclosed in Japanese Patent Laid-Open No. 2001-345453 may be adopted.

Figure 5:
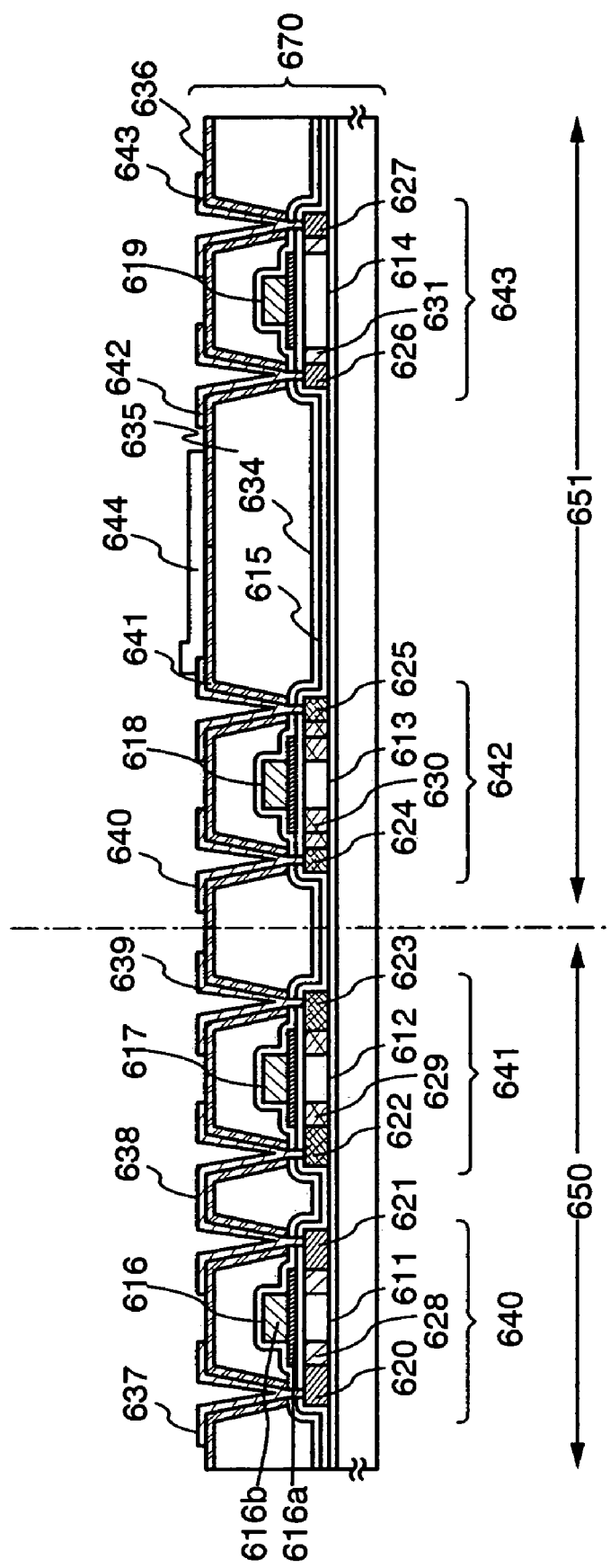
FIG. 5 shows manufacturing steps of an active matrix substrate using the present invention.

Next, after a second insulating film 634 is formed over the gate electrode and the gate insulating film, as shown in FIG. 5, heat treatment, irradiation of strong light or a laser beam is performed to activate the doped impurity element. This step enables the gate insulating film, and an interface between the gate insulating film and the semiconductor film to recover from plasma damages as well as to be activated.

Next, a first interlayer insulating film 635 is formed over the second insulating film 634. An inorganic insulating film such as acrylic resin, polyimide resin, polyester resin, epoxy resin, polyeter, polyurethane, siloxane, or polysilazane; or an organic material resin can be used for the first interlayer insulating film. When an organic resin is employed, a photosensitive resin or a non-photosensitive resin can be employed. In the case where a photosensitive organic resin is used, a first opening having a curvature can be formed by exposure by photolithography and by etching of the photosensitive organic resin thereafter. It is advantageous to form such an opening having a curvature, because the coverage of an electrode to be formed later can be improved. A non-photosensitive acrylic resin film having a thickness of 1.05 µm is formed over the first interlayer insulating film in this embodiment.

Next, patterning and etching of the first interlayer insulating film are performed, and the first opening is formed. After that, a third insulating film 636 including a nitride insulating film (typically, a silicon nitride film or a silicon oxynitride film) is formed so as to cover the first opening and the first interlayer insulating film 635. A silicon nitride film is employed for the third insulating film in this embodiment.

After exposure by photolithography is performed, the third insulating film 636, the second insulating film 634 and the gate insulating film 615 are etched sequentially; thus, a second opening is formed. Etching here may either be wet etching or dry etching. The second opening is formed by dry etching in this embodiment.

After the second opening is formed; a metal film is formed over the third insulating film and the second opening; exposure is performed by photolithography; and a metal film is etched, thereby forming a source electrode and drain electrodes 637 to 643. A film including an element selected form aluminum (Al), titanium (Ti), molybdenum (Mo), tungsten (W), and silicon (Si); or an alloy film thereof is used for the metal film. In this embodiment, after a titanium film/ an aluminum-silicon alloy film/ a titanium film (Ti/Al-Si/Ti) are laminated with thicknesses of 100 nm/ 350 nm/ 100 nm respectively, patterning and etching are performed to have a desired shape; thus, the source electrode and the drain electrodes 637 to 643 are formed. Thereafter, a first pixel electrode 644 is formed.

As described above, n-channel TFTs 640 and 643, and p-channel TFTs 641 and 642 can be formed.

Further, the n-channel TFT 640 and the p-channel TFT 641 are used for a driver circuit 650 as a CMOS circuit, and the p-channel TFT 642 and the n-channel TFT 643 are used for a pixel area 651; thus, an active matrix substrate 670 in which a driver circuit and a pixel area are formed on the same substrate can be obtained.

Next, steps for forming an EL (electro luminescence) element over the active matrix substrate thereby forming a display device will be explained.

Figure 6A:
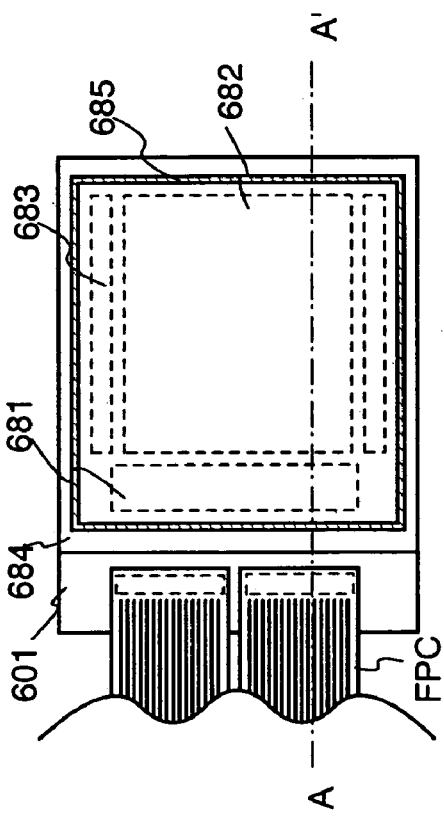
FIGS. 6A and 6B show manufacturing steps of a display device using the present invention.
Figure 6B:
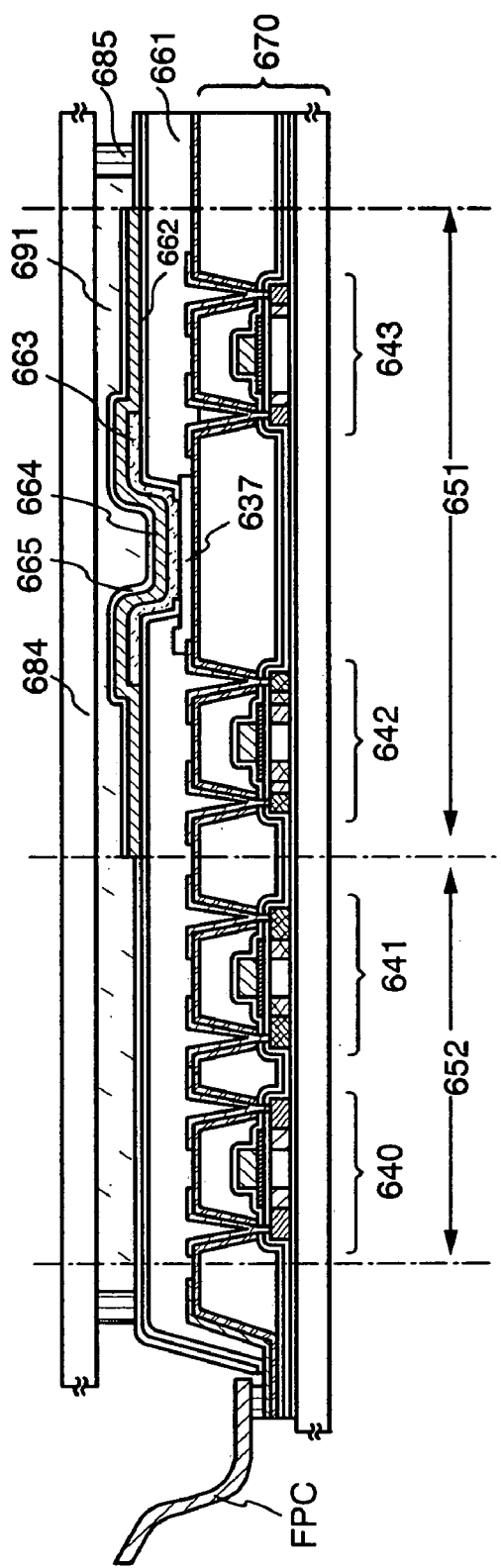

FIG. 6A shows a top view of the display device. FIG. 6B shows a cross section taken along the line A-A' in FIG. 6A. A dotted line 681 shows a source signal line driver circuit, reference numeral 682 denotes a pixel area, reference numeral 683 denotes a gate signal line driver circuit. Reference numeral 684 denotes a counter substrate. Reference numeral 685 denotes a sealant containing a gap material for maintaining a gap between a pair of substrates; and the inner space that is surrounded by the sealant 685 is filled with an encapsulant.

FIG. 6B is a cross section of the display device. An EL element is formed in a pixel area 651 of an active matrix substrate 670. A source line driver circuit 652 is shown as a driver circuit in FIG. 5; a CMOS circuit in which the n-channel TFT 640 and the p-channel TFT 641 are combined is formed. The active matrix substrate 670 and the counter substrate 684 are sealed by using the sealant 685 and an encapsulant 691.

A manufacturing method of a display device is described below.

As shown in FIG. 6B, a second interlayer insulating film 661 is formed over the surface of the active matrix substrate 670, and a third opening is formed. Note that, the p-channel TFT 642 of the pixel area in FIG. 5 is used as a current control TFT of a pixel, and the n-channel TFT 643 is used as a switching TFT of a pixel. Further, an inorganic material such as acrylic resin, polyimide resin, polyester resin, epoxy resin, polyeter, polyurethane, siloxane, or polysilazane; or an organic material may be used for the second interlayer insulating film 661. In this embodiment, a photosensitive acrylic resin film is employed for the second interlayer insulating film; patterning and wet etching are performed; and the third opening having a gently curved surface is formed.

After a fourth insulating film 662 is formed over the second interlayer insulating film, a fourth opening is formed, and the first pixel electrode 637 is exposed. In this embodiment, the fourth insulating film is formed from a silicon nitride film according to the technique of Embodiment Mode 1. First, pressure in a chamber as shown in FIG. 1A shall be 10 Pa, a source gas of silane gas and nitrogen are supplied at a flow ratio of 1:200, and a high frequency voltage of 13.56 MHz is applied to the electrode; thus, a silicon nitride film that is a product is formed concurrently with the generation of plasma 123.

Next, as shown in FIG. 1B, a substrate in which the third opening is previously formed is arranged in a chamber. Sputtering is performed by using silicon nitride as a target, and argon gas supplied into the chamber through the distribution system 106a as a puttering gas thereby depositing a silicon nitride film on the substrate surface. Hereupon, the temperature in the chamber shall be 200° C. or less to form the silicon nitride film on an acrylic resin.

When an organic resin is used for the second interlayer insulating film 661, the silicon nitride film of the fourth insulating film has an effect of blocking a gas generated in the organic resin and moisture generated in the whole substrate. Therefore, by forming the fourth insulating film, deterioration of the EL element can be controlled. Further, the silicon nitride film has another effect of blocking a metal ion (generally, an alkali metal ion such as a lithium ion ($Li^+$), a sodium ion ($Na^+$), or a potassium ion ($K^+$)) that is a material of the electrode to be later formed on the surface of the fourth insulating film. The silicon nitride film formed in this step has low hydrogen content, so that the hydrogen is not desorbed from the silicon nitride film by application of voltage or by heat. Therefore, effects of blocking moisture or metal ions are further enhanced, compared with the one formed by an existing plasma CVD technique.

Next, an EL element 663, a second pixel electrode 664 functioning as a cathode, and a passivation film 665 are provided over the pixel electrode 637 and the fourth insulating film 662. The part where the first pixel electrode 637, the EL layer 663, and the second pixel electrode 664 are superimposed is to be the element (EL element) that substantially emits light.

The structure of the EL layer 663 can employ a well-known structure. A light emitting layer, a hole injection layer, an electron injection layer, a hole transport layer, and an electron transport layer are included in the EL layer 663 that is disposed between the first pixel electrode 637 and the second pixel electrode 664. In that case, the form in which these layers are laminated or the form in which a part or all of materials forming these layers are mixed can be employed. An EL element generally has a structure in which an anode/ a light emitting layer/ a cathode are laminated sequentially. In addition to the structure, another structure in which an anode/ a hole injection layer/ a light emitting layer/ a cathode, or an anode/ a hole injection layer/ a light emitting layer/ an electron transport layer / a cathode are laminated sequentially may be employed.

A light emitting layer is formed by using organic compounds. For example, the light emitting layer includes a layer that is formed from one or more materials selected from low molecular weight organic compounds, intermediate molecular weight organic compounds such as dendrimer and oligomer, and high molecular weight organic compounds, which are sorted on the basis of the number of molecules. Further, the light emitting layer may be formed by further combining an electron injection transporting layer or a hole injection/ transport layer which are formed from an inorganic compound having electron injecting transporting characteristics or hole injection/transport characteristics.

Examples of a luminescent material that is to be a base of the light emitting layer are given below. A metal complex such as a tris-8-quinolinolato aluminum complex and bis (benzoquinolinolato) beryllium complex, or phenyl anthracenes, tetraaryl diamine derivative, distyrylbenzene derivative, or the like can be used as a low molecular weight organic compound. Further, by doping using one of these materials as a host and coumarin derivative, dichloromethane (DCM), quinacridon, or rubrene as a dopant; thus, quantum efficiency, brightness, and performance can be improved. A high molecular weight organic compound may be selected from polyparaphenylene vinylenes, polyparaphenylenes, polythiophenes, polyfluorenes, and the like. Specifically, it may be selected from poly(p-phenylene vinylene): (PPV), poly (2,5-dialkoxy-1,4-phenyene vinylene): (RO-PPV), poly [2-(2'-ethylhexoxy)-5-methoxy-1,4-phenylene vinylene]: (MEH-PPV), poly[2-dialkoxyphenyl]-1,4-phenylene vinylene]: (ROPh-PPV), poly[p-phenylene]: (PPP), Poly(2, 5-dialkoxy-1,4-phenylene): (RO-PPP), poly(2,5-dihexoxy-1, 4-phenylene), polythiophene: (PT), poly(3-alkylthiophene): (PAT), poly(3-hexylthiophene): (PHT), poly (3-cyclohexylthiophene): (PCHT), poly(3-cyclohexyl-4-methylthiophene): (PCHMT), poly(3,4-dicyclohexylthiophene): (PD-CHT), poly[3-(4octylphenyl)-thiophene]: (POPT), poly[3-(4-octylphenyl)- 2,2-bithiophene]: (PTOPT), polyfluorene: (PF), poly(9,9-dialkylfluorene): (PDAF), poly(9,9-dioctylfluorene): (PDOF), and the like.

As an inorganic compound which can be employed as an electron injecting transporting layer or a hole injection/transport layer, diamond like carbon (DLC), Si, Ge, CN; an oxide or a nitride thereof; or one of the above material that is appropriately doped with P, B, or N. Further, an oxide, a nitride, or a fluoride of alkali metal or alkaline earth metal can be employed, too. Further, a compound or alloy of the above metal and Zn, Sn, V, Ru, Sm or In may be used instead.

Further, a mixed junction structure in which those respective layers are mixed may be formed.

Note that, the luminescence of an EL element can be divided into two types: one is light that is acquired when a singlet excited state returns back to a ground state (fluorescent light) and the other that is acquired when a triplet excited state returns back to the ground state (phosphorescent light). Either or both types of the luminescence can be used for the EL element in the present invention.

A multi-component alloy or a compound, which is constituted of a metal component and a component containing either or both of alkali metal and alkali earth metal, is used for the second pixel electrode 664. Al, Au, Fe, V, and Pd are given as examples of the metal components. Specific examples of the alkali metal or alkali earth metal include Li (lithium), Na (sodium), K (potassium), Rb (rubidium), Cs (cesium), Mg (magnesium), Ca (calcium), Sr (strontium), and Ba (barium). In addition, Yb (ytterbium), Lu (lutetium), Nd (neodymium), Tm (thulium), or the like may be applied. The second electrode shall be made of an alloy or a compound which contains 0.01% to 10% by weight of alkali metal or alkali earth metal having a work function of 3 eV or less in the metal component. For the purpose of making the second electrode serve as a cathode, the thickness of the second electrode may be arranged appropriately and may be formed by electron beam evaporation so as to have a thickness range of about 0.01 µm to 1 µm.

A passivation film 665 may be selected from a silicon nitride film, an aluminum nitride film, a thin film containing carbon as a major component (a DLC film, a CN film or the like), and other insulating films having high moisture and oxygen blocking ability.

Next, in order to seal the active matrix substrate 670, a counter substrate 684 is pasted to the substrate with a sealing material 685 and the encapsulant 691 under an inert gas atmosphere. It is preferable to use an epoxy resin with high viscosity including filler as a material for the sealing material 685. The encapsulant 691 is preferably formed from an epoxy resin having a low viscosity as well as high transparency. It is also desirable that the sealing material 685 and the encapsulant 691 highly blocks moisture or oxygen.

Note that, a manufacturing steps of an EL display device are described in this embodiment; however, the steps can be applied to other display devices such as a liquid crystal display device and a field emission display device.

Further, Embodiment Mode 1 is employed as the fourth film formation method in this embodiment; however, Embodiment Mode 2 may be used alternatively.

Further, the film formation method of the present invention is applied to the fourth insulating film that is a protective film in this embodiment. However, it can be applied to the formation of a base insulating film, an amorphous silicon film, a gate insulating film, a second insulating film, a third insulating film, or a passivation film.

A display device described in the above embodiments can be used for a display of various electronic devices. Note that, the electronic devices here are defined as products on which display devices are mounted. As such electronic devices, video cameras, still cameras, projectors, projection TVs, head mounted displays, car navigations, personal computers (including laptops), handheld terminals (such as mobile computers and mobile phones) can be given.

According to this embodiment, deterioration of a semiconductor element or an EL element caused by an alkali metal ion or moisture can be controlled and a display device can be formed in high yield.

Embodiment 2

Figure 2:
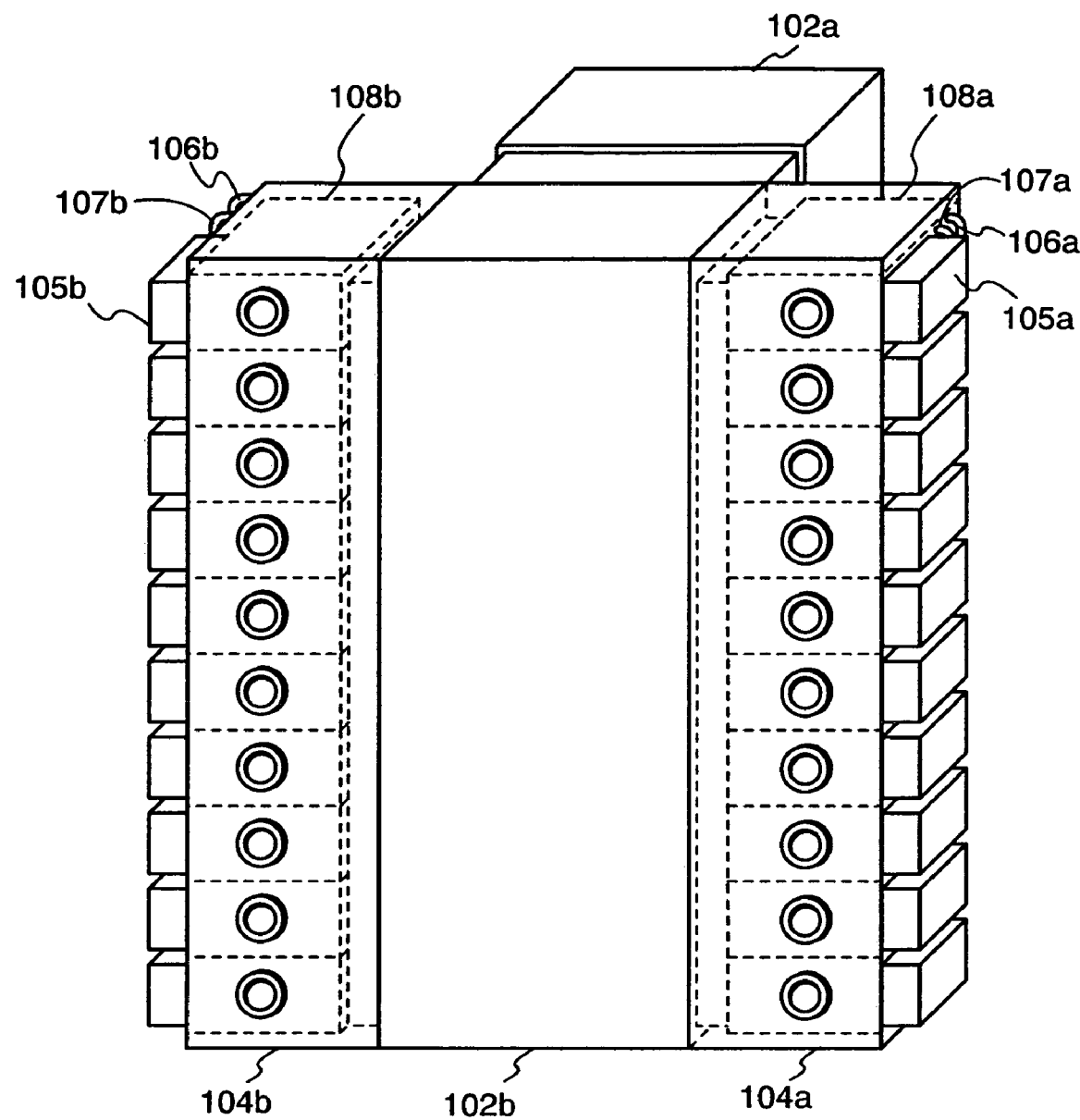
FIG. 2 shows a perspective view of a film formation system used in the present invention.
Figure 3:
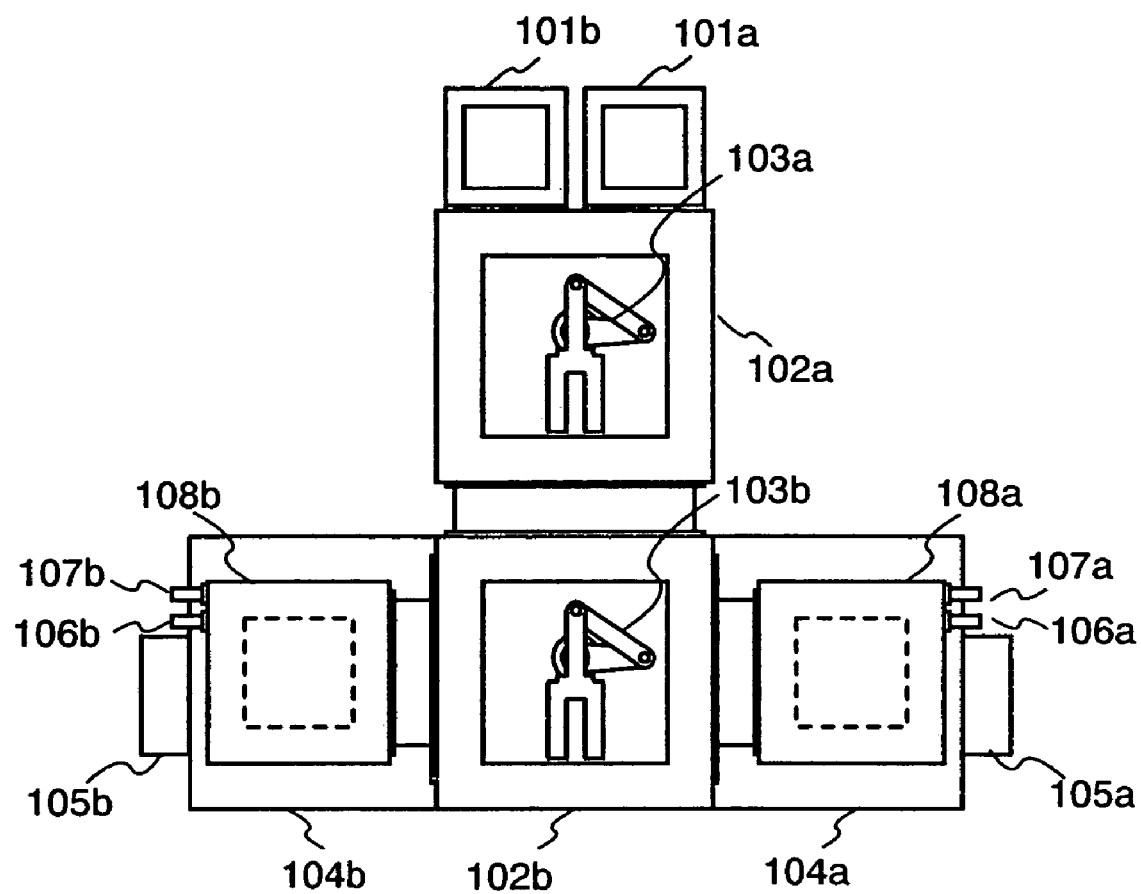
FIG. 3 shows a top view of a film formation system used in the present invention.

In this embodiment, a film formation system employed for Embodiment 1 will be described with reference to FIG. 2 and FIG. 3. FIG. 2 shows a perspective view of a film formation system. FIG. 3 shows a top view thereof. Reference numerals denoting the same components in both figures are used in common. A film formation system of the present invention has a structure in which a film formation chamber and a transfer chamber are provided, and a transfer chamber 102b is disposed between film formation chambers 104a and 104b, and transfer chambers 102a and 102b are disposed adjacent to each other. Each film formation chamber is equipped with ten chambers 108a and 108b which are stacked lengthwise, distribution systems 106a and 106b for supplying film formation gas into respective chambers 108a and 108b, exhaust system 107a and 107b for exhausting exhaust gas, and power supplies 105a and 105b.

As for this system, all distribution systems of plural chambers 108a and 108b in respective film formation chambers 104a and 104b are connected to one supply source. Similarly, all exhaust systems of plural chambers 108a and 108b in respective film formation chambers 104a and 104b are connected to one exhaust port. Accordingly, although plural chambers 108a and 108b are stacked lengthwise in this system, the distribution systems 106a and 106b, and the exhaust systems 107a and 107b can easily be provided. Further, exhaust systems (not shown) for reducing pressure in each film formation chamber is provided in the film formation chambers 104a and 104b. Film formation and cleaning of the chamber can be performed alternately by controlling pressure in the chamber and pressure in the film formation chamber and a film can be formed efficiently.

In FIG. 3, a substrate with a desired size having an insulating surface such as a glass substrate or a resin substrate typified by a plastic substrate is arranged in cassettes 101a and 101b. Horizontal transportation is adopted in the illustrated carrier method for carrying a substrate. When a substrate of the fifth generation or later, which has a size of one meter or more per side is used, vertical transportation in which a substrate is set vertically may be adopted thereby reducing the area occupied by the conveyer.

Each of the transfer chambers 102a and 102b is equipped with transport mechanisms (robot arms) 103a and 103b. A substrate arranged in cassette 101a and 101b by transport mechanism is transported to respective film formation chambers 104a and 104b. And, a predetermined treatment is performed on the surface of the transported substrate to be processed in the chambers 108a and 108b in the film formation chambers 104a and 104b. The explanation on chambers 108a and 108b is omitted here since it is described in Embodiment Mode 1. Further, plural transfer chambers are provided in this embodiment; however, they may be replaced by one transfer chamber.

A batch system which can process dozens of substrates at a time is shown in this embodiment; however, the present invention may also be applied to a single substrate system processing substrates one by one.

As in this embodiment, many substrates can be formed at a time under equal conditions by forming the film with a film formation system having plural chambers. Therefore, variations between substrates can be reduced, and the yield can be improved. Further, the throughput can also be improved.

The present invention discloses a film formation method in which a product formed by plasma CVD is sputtered and precipitated on a surface of a substrate to be processed in one chamber, and a manufacturing method of a semiconductor device therewith. According to the present invention, a product can be formed without a target or impurities penetrating from an atmosphere in comparison with existing sputtering methods.

Further, unlike in the case of an existing plasma CVD technique, a product with a few impurities, particularly, with less contamination of hydrogen from a material can be formed over a surface of the substrate to be processed. Accordingly, a film that is hard to be affected by application of voltage or heating can be formed.

Further, when a film is formed on a surface of a substrate to be processed, a film is formed by sputtering, so that a film can be formed on a substrate, a member, or a film each of which is formed from a low heat-resistant material such as a resin can be formed without requiring heat treatment at a high temperature.

Further, deterioration of a semiconductor device can be controlled by applying a film formed according to the manufacturing method of the present invention to a semiconductor device, for example, a protective film of a semiconductor element composing a semiconductor device.

When a film formation method is applied to a film formation system having plural chambers, many substrates can be formed at a time under equal conditions. Therefore, variations between substrates can be reduced, and the yield can be improved.

What is claimed is:

1. A film formation method comprising the steps of:
   forming a first film on an electrode provided in a chamber by a CVD method using a first gas;
   installing a substrate into the chamber after forming the first film; and
   forming a second film over a surface of the substrate by a sputtering method using the first film as a target and a second gas in the chamber.

2. A film formation method according to claim 1, wherein the second film is formed at a pressure of 20 Pa or less.

3. A film formation method according to claim 1, wherein the second film is formed over one selected from the group consisting of a glass substrate, a plastic substrate, and an organic resin film.

4. A film formation method according to claim 1, wherein a semiconductor device is manufactured by using the second film as a protective film of a semiconductor element.

5. A film formation method according to claim 4, wherein the semiconductor element comprises at least one selected from the group consisting of a thin film transistor, an organic thin film transistor, a thin film diode, a photoelectric conversion element, and a resistor.

6. A film formation method comprising the steps of:
   forming a first film on an electrode provided in a chamber by a CVD method using a first gas;
   installing a substrate into the chamber after forming the first film; and
   forming a silicon nitride film over a surface of the substrate by a sputtering method using the first film as a target and a second gas in the chamber.

7. A film formation method according to claim 6, wherein the first gas comprises a silicide gas and nitrogen.

8. A film formation method according to claim 6, wherein the second gas comprises at least one selected from the group consisting of helium (He), neon (Ne), argon (Ar), krypton (Kr), and xenon (Xe).

9. A film formation method according to claim 6, wherein the silicon nitride film is formed at a pressure of 20 Pa or less.

10. A film formation method according to claim 6, wherein the second film is formed over one selected from the group consisting of a glass substrate, a plastic substrate, and an organic resin film.

11. A film formation method according to claim 7, wherein the silicide gas comprises at least one selected from the group consisting of monosilane, disilane, and trisilane.

12. A film formation method according to claim 6, wherein a semiconductor device is manufactured by using the silicon nitride film as a protective film of a semiconductor element.

13. A film formation method according to claim 12, wherein the semiconductor element comprises at least one selected from the group consisting of a thin film transistor, an organic thin film transistor, a thin film diode, a photoelectric conversion element, and a resistor.

14. A method for manufacturing a semiconductor device comprising:
   forming a thin film transistor over a substrate, wherein the thin film transistor comprises an active region and a gate electrode with a gate insulating film interposed therebetween;
   forming a first film on an electrode provided in a chamber by a CVD method using a first gas;
   installing the substrate into the chamber after forming the first film; and
   forming a second film over the thin film transistor by a sputtering method using the first film as a target and a second gas in the chamber.

15. A method for manufacturing a semiconductor device according to claim 14, wherein the second film is formed at a pressure of 20 Pa or less.

16. A method for manufacturing a semiconductor device according to claim 14, wherein the substrate comprises at least one selected from the group consisting of a glass substrate, a plastic substrate, and an organic resin film.

17. A method for manufacturing a semiconductor device according to claim 14, further comprising a step of forming an EL layer and an electrode over the second film.

18. A method for manufacturing a semiconductor device comprising:
   forming a thin film transistor over a substrate, wherein the thin film transistor comprises an active region and a gate electrode with a gate insulating film interposed therebetween;
   forming a first film on an electrode provided in a chamber by a CVD method using a first gas;
   installing the substrate into the chamber after forming the first film; and
   forming a silicon nitride film over the thin film transistor by a sputtering method using the first film as a target and a second gas in the chamber.

19. A method for manufacturing a semiconductor device according to claim 18, wherein the first gas comprises a silicide gas and nitrogen.

20. A method for manufacturing a semiconductor device according to claim 19, wherein the silicide gas comprises at least one selected from the group consisting of monosilane, disilane, and trisilane.

21. A method for manufacturing a semiconductor device according to claim 18, wherein the second gas comprises at least one selected from the group consisting of helium (He), neon (Ne), argon (Ar), krypton (Kr), and xenon (Xe).

22. A method for manufacturing a semiconductor device according to claim 18, wherein the second film is formed at a pressure of 20 Pa or less.

23. A method for manufacturing a semiconductor device according to claim 18, wherein the substrate comprises at least one selected from the group consisting of a glass substrate, a plastic substrate, and an organic resin film.

24. A method for manufacturing a semiconductor device according to claim 18, further comprising a step of forming an EL layer and an electrode over the second film.

25. A film formation method comprising the steps of:
   forming a first film on an electrode provided in a chamber by a CVD method using a first gas;
   installing a substrate into the chamber after forming the first film; and
   forming a silicon nitride film over a surface of the substrate by a sputtering method using the first film as a target and a second gas in the chamber.

26. A film formation method according to claim 25, wherein the first gas comprises a silicide gas and nitrogen.

27. A film formation method according to claim 25, wherein the second gas comprises at least one selected from the group consisting of helium (He), neon (Ne), argon (Ar), krypton (Kr), and xenon (Xe).

28. A film formation method according to claim 25, wherein the silicon nitride film is formed at a pressure of 20 Pa or less.

29. A film formation method according to claim 25, wherein the silicon nitride film is formed over one selected from the group consisting of a glass substrate, a plastic substrate, and an organic resin film.

30. A film formation method according to claim 26, wherein the silicide gas comprises at least one selected from the group consisting of monosilane, disilane, and trisilane.

31. A film formation method according to claim 25, wherein a semiconductor device is manufactured by using the silicon nitride film as a protective film of a semiconductor element.

32. A film formation method according to claim 31, wherein the semiconductor element comprises at least one selected from the group consisting of a thin film transistor, an organic thin film transistor, a thin film diode, a photoelectric conversion element, and a resistor.

33. A method for manufacturing a semiconductor device comprising:
   forming a thin film transistor over a substrate, wherein the thin film transistor comprises an active region and a gate electrode with a gate insulating film interposed therebetween;
   forming a first film on an electrode provided in a chamber by a CVD method using a first gas;
   installing the substrate into the chamber after forming the first film; and
   forming a second film over the thin film transistor by a sputtering method using the first film as a target and a second gas in the chamber.

34. A method for manufacturing a semiconductor device according to claim 33, wherein the first gas comprises a silicide gas and nitrogen.

35. A method for manufacturing a semiconductor device according to claim 33, wherein the second gas comprises at least one selected from the group consisting of helium (He), neon (Ne), argon (Ar), krypton (Kr), and xenon (Xe).

36. A method for manufacturing a semiconductor device according to claim 33, wherein the second film is formed at a pressure of 20 Pa or less.

37. A method for manufacturing a semiconductor device according to claim 33, wherein the second film is formed over one selected from the group consisting of a glass substrate, a plastic substrate, and an organic resin film.

38. A method for manufacturing a semiconductor device according to claim 34, wherein the suicide gas comprises at least one selected from the group consisting of monosilane, disilane, and trisilane.

39. A method for manufacturing a semiconductor device according to claim 33, further comprising a step of forming an EL layer and an electrode over the second film.

40. A film formation method according to claim 1, wherein the sputtering method is a sputtering method using a magnetron discharge.

41. A film formation method according to claim 6, wherein the sputtering method is a sputtering method using a magnetron discharge.

42. A method for manufacturing a semiconductor device according to claim 14, wherein the sputtering method is a sputtering method using a magnetron discharge.

43. A method for manufacturing a semiconductor device according to claim 18, wherein the sputtering method is a sputtering method using a magnetron discharge.

44. A film formation method according to claim 25, wherein the sputtering method is a sputtering method using a magnetron discharge.

45. A method for manufacturing a semiconductor device according to claim 33, wherein the sputtering method is a sputtering method using a magnetron discharge.

* * * * *